United States Patent
Shaw et al.

(10) Patent No.: US 6,651,016 B1
(45) Date of Patent: Nov. 18, 2003

(54) JITTER-CORRECTED SPECTRUM ANALYZER

(75) Inventors: Jonathan M. Shaw, Rochester, NY (US); John B. Shaw, Aloha, OR (US)

(73) Assignee: Credence Systems Corporation, Fremont, CA (US)

( * ) Notice: Subject to any disclaimer, the term of this patent is extended or adjusted under 35 U.S.C. 154(b) by 113 days.

(21) Appl. No.: 10/028,097

(22) Filed: Dec. 21, 2001

(51) Int. Cl.[7] .............................................. G01R 13/00
(52) U.S. Cl. .......................... 702/69; 702/76; 702/77; 702/89; 702/79; 324/76.19; 324/76.21; 324/76.22
(58) Field of Search .............................. 702/89, 76, 77, 702/125, 69, 79, 189; 324/76.19, 76.21, 76.11, 76.22

(56) References Cited

U.S. PATENT DOCUMENTS

| | | | | |
|---|---|---|---|---|
| 4,251,754 A | * | 2/1981 | Navarro et al. | 315/370 |
| 4,791,577 A | * | 12/1988 | Winter | 702/77 |
| 5,293,520 A | * | 3/1994 | Hayashi | 324/76.77 |
| 5,557,196 A | * | 9/1996 | Ujiie | 324/76.77 |
| 6,185,509 B1 | * | 2/2001 | Wilstrup et al. | 702/69 |

OTHER PUBLICATIONS

Jenq, Y.C.; "Sampling Clocks Based on High-Resolution Timing Unit;" Nov. 3, 2000; Portland, Oregon.

* cited by examiner

*Primary Examiner*—John Barlow
*Assistant Examiner*—Anthony Dougherty
(74) *Attorney, Agent, or Firm*—Daniel J. Bedell; Smith-Hill and Bedell

(57) ABSTRACT

An analog signal is digitized by an analog-to-digital (A/D) converter clocked by a periodically jittery clock signal. Elements of the digital data sequence (vector) output of the A/D converter are sorted into a set of smaller vectors according to clock signal jitter phase and each of the smaller vectors is then separately subjected to Fourier transform and time shift functions. The resulting vectors are then processed to produce an output vector representing the frequency spectrum of the analog signal.

11 Claims, 4 Drawing Sheets

JITTER-CORRECTED SPECTRUM ANALYZER

BACKGROUND OF THE INVENTION

1. Field of the Invention

The present invention relates in general to a spectrum analyzer for processing data obtained by periodically digitizing an analog signal to determine the signal's frequency spectrum, and in particular to a spectrum analyzer that compensates for errors arising from jitter in a clock signal controlling digitization timing.

2. Description of Related Art

Figure 1:
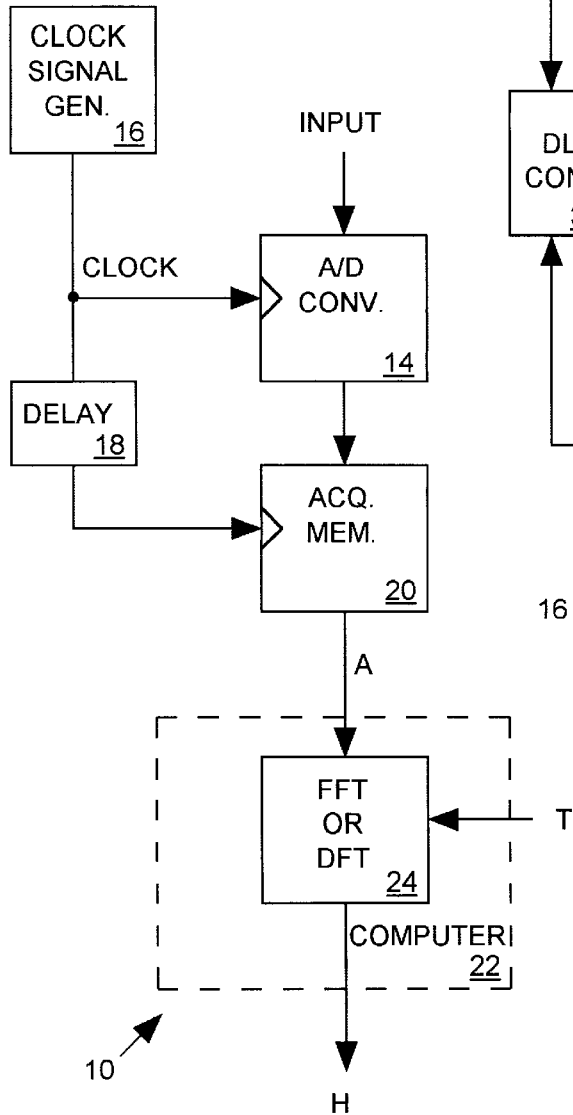

FIG. 1 illustrates a prior art spectrum analyzer 10 for producing an output digital data sequence ("vector") H representing the amplitude and phase of the various frequency components of an analog input signal (INPUT). Spectrum analyzer 10 includes an A/D converter 14 for digitizing the INPUT signal in response to leading edges of successive pulses of a CLOCK signal produced by a clock signal generator 16. Trailing edges of the CLOCK signal tell an acquisition memory 20 to store each data value A/D converter 14 produces. After N CLOCK signal cycles, acquisition memory 20 will contain an N-element vector $A = \{A_0 \ldots A_{N-1}\}$ representing the INPUT signal magnitude sampled at intervals T seconds apart where T is the period of the CLOCK signal. A computer 22 then reads the time domain vector out of acquisition memory 20 and subjects it to a discrete Fourier transform (DFT) function or a fast Fourier transform (FFT) function to produce an N/2+1 element vector of complex numbers $H \{H_0 \ldots H_{N/2}\}$ where each number indicates a magnitude and phase of a separate frequency component of the INPUT signal.

Since the FFT or DFT function 24 uses the period T of the CLOCK signal as an input parameter, the accuracy with which the output vector H characterizes the frequency spectrum of the INPUT signal depends in part on the accuracy with which clock signal generator 16 generates each CLOCK signal edge.

Figure 2:
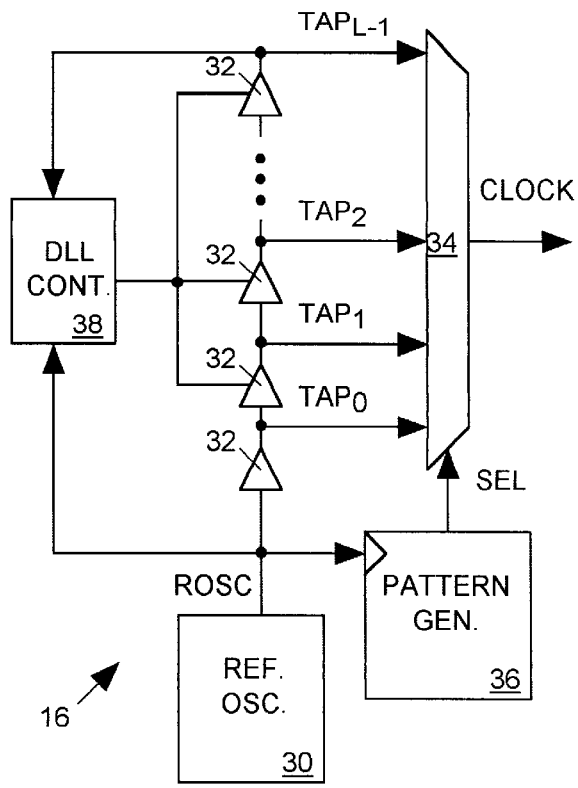

FIG. 2 illustrates a prior art clock signal generator 16 for producing a CLOCK signal having an adjustable period. A reference oscillator 30 produces a high frequency reference signal ROSC of stable period P that is successively delayed by a series of L logic gates 32 to produce a set of tap signals $TAP_0-TAP_{L-1}$. A delay lock loop (DLL) controller 38 compares the phase of the $TAP_{L-1}$ signal to the ROSC signal and adjusts the switching delay of each gate 32 so that $TAP_{L-1}$ is in phase with the ROSC signal, thereby ensuring that the average delay of each gate 32 is P/L. Thus each tap signal $TAP_0-TAP_{L-1}$ will have the same period P as the ROSC signal, but the tap signals will be distributed in phase. A multiplexer 34, controlled by a vector SEL from a pattern generator 36, produces the output CLOCK signal by selecting edges of tap signals $TAP_0-TAP_{L-1}$. Pattern generator 36 produces a next element of its SEL output vector in response to each edge of the ROSC signal. Pattern generator 36 controls the period of the CLOCK signal by the order in which it signals multiplexer 34 to select tap signal edges to be delivered to its output as CLOCK signal edges.

Figure 3:
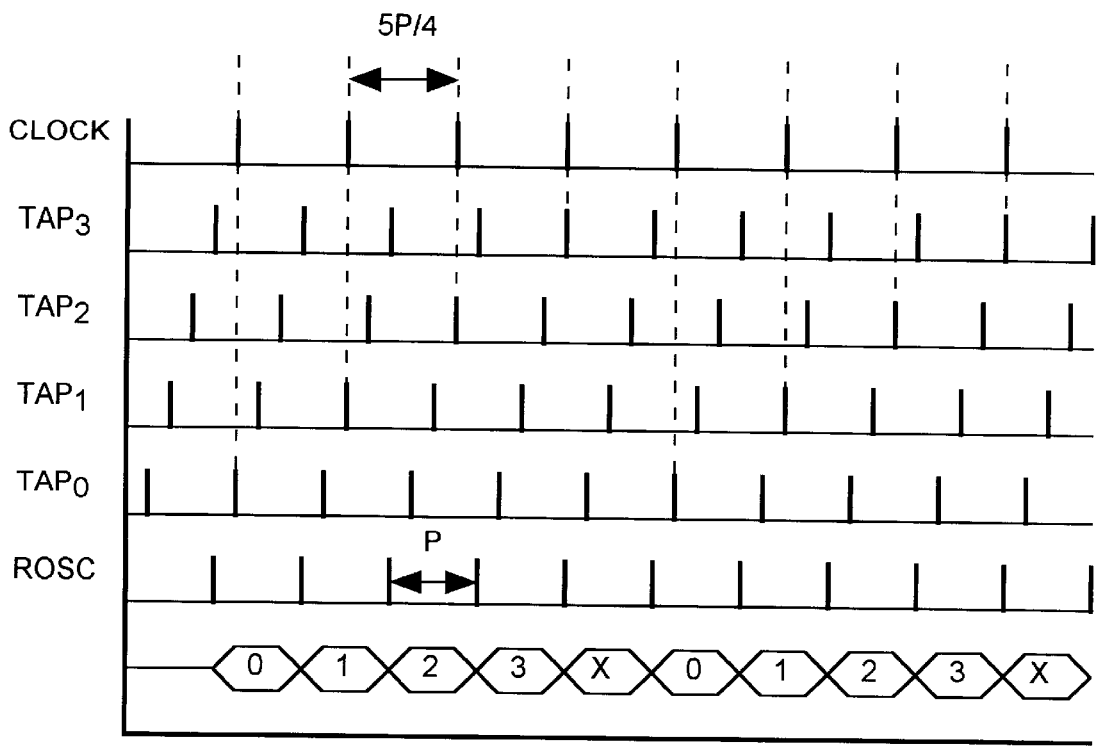

For example suppose L=4 so that each gate 32 has a nominal delay of P/4 and, we want clock signal generator 16 to produce eight CLOCK signal edges with a period 5P/4 between edges as illustrated in FIG. 3. Then pattern generator 36 can be programmed to respond to a set of 10 ROSC signal edges by generating the following SEL vector:

SEL={0,1,2,3, X,0,1,2,3, X}

The numbers indicate which tap signal is to be selected in response to successive ROSC signal edges. An "X" indicates that pattern generator 36 tells multiplexer to select none of its input tap signals $TAP_0-TAP_3$. As shown in FIG. 3, the above SEL vector causes multiplexer 34 to respond to the first four ROSC signal edges by selecting each tap signal $TAP_0-TAP_3$ in turn to provide an edge of the output CLOCK signal. Multiplexer 34 responds to the fifth ROSC edge by selecting none of the tap signals to provide a CLOCK signal edge. The same pattern is repeated for the next five ROSC signal edges. Thus the clock signal generator 16 produces eight CLOCK signal edges 5P/4 seconds apart in response to ten ROSC signal pulses P seconds apart.

One problem with the clock signal generator 16 of FIG. 2 is that while gates 32 may be of similar design and implemented on the same integrated circuit chip, and while all gates 32 may be controlled by the same control signal output of DLL controller 38, all gates 32 will have slightly different delays due to process variations between the gates. While DLL controller 38 ensures that the sum of the gate delays will be P and that the average delay of each gate will be P/L, some gates 32 will have switching delays slightly larger than P/L and some will have delays smaller than P/L.

A clock signal is said to be "jittery" when the clock signal has some constant average period T between edges over a number of clock signal cycles, but the actual period between them tends to vary from edge-to-edge. A clock signal has "random jitter" when the edge timing error changes randomly from edge-to-edge. Random jitter typically arises from system noise. A clock signal has "periodic jitter" when the edge timing variation is periodic. In a periodically jittery clock signal having an average period T and a periodic jitter of MT, for all values of $0 \leq K < M$, an actual timing of each $K^{th}$ clock signal edge and every $M^{th}$ edge thereafter differs by a similar amount $JITTER_K$ from a nominal timing each edge would have had if the clock signal had a constant period T between edges.

In the example illustrated in FIG. 3 every edge of tap signal $TAP_0$ has the same error, $JITTER_0$. Since the first and every 4th edge of the clock signal thereafter is derived from tap signal $TAP_0$, then the first and every 4th edge of the clock signal has the same timing error, $JITTER_0$. More generally, since all edges of the Kth tap signal $T_K$ (for K=0 to 3) have the same timing error $JITTER_K$, and since the Kth edge of the clock signal and every 4th edge thereafter is derived from an edge of the $K^{th}$ tap signal, then the $K^{th}$ edge of the clock signal and every $4^{th}$ edge thereafter has the same timing error, $JITTER_K$. The clock signal produced by clock signal generator 16 is therefore periodically jittery and the jitter has a period TM, where M=4 in the above example.

The edge timing errors in the clock signal produced by timing signal generator 16 are not only periodic, they are also predictable. If we measure the delay of each gate 32, and we know in advance which tap signal $TAP_0-TAP_{M-1}$ will produce each edge of the clock signal, then we can predict the timing error in each clock signal edge. Y. C. Jenq, in a paper entitled "Sampling Clocks Based on High-Resolution Timing Unit" published Nov. 3, 2000, teaches that it is possible to modify the DFT function of FIG. 1 to take into account the predictable jitter error in each clock signal edge so that the DFT function produces an output vector H accurately representing the frequency spectrum of the A/D converter's analog INPUT signal. While Jenq's modified DFT function eliminates the effects of periodic jitter in the clock signal on the output vector H, the complex modified DFT function requires a relatively large amount of processing time.

What is needed is a less computationally intensive method for processing an A/D converter output vector to produce a vector representing the frequency spectrum of the A/D converter's analog input signal, wherein errors arising from predictable periodic clock signal jitter are substantially eliminated.

BRIEF SUMMARY OF THE INVENTION

An analog signal is digitized by an analog-to-digital (A/D) converter clocked by edges of a periodically jittery clock signal to produce an output digital data sequence (vector) A in which each successive data element represents an amplitude of the analog signal at the time of occurrence of a corresponding one of the clock signal edges. The clock signal has an average period T between edges but has a jitter of period MT so that each Kth edge and every Mth edge thereafter has the same timing error, $JITTER_K$.

In accordance with the invention, elements of vector A are sorted into a set of M smaller vectors $B_0$–$B_{M-1}$ according to clock signal jitter phase, and each of vectors $B_0$–$B_{M-1}$ is separately subjected to Fourier transform, time shift and alias reconstruction functions to produce a set of vectors $E_0$–$E_{M-1}$ Vectors $E_0$–$E_M$ are then subjected to a correction function to produce a set of vectors $G_0$–$G_{M-1}$ which combine to form a single output vector H representing the frequency spectrum of the analog signal.

It is accordingly an object of the invention to provide a method for producing output data representing the frequency spectrum of a digitized analog input signal that is compensated for periodic jitter in the timing of edges of a clock signal controlling digitization timing.

The claims portion of this specification particularly points out and distinctly claims the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWING(S)

Figure 4:
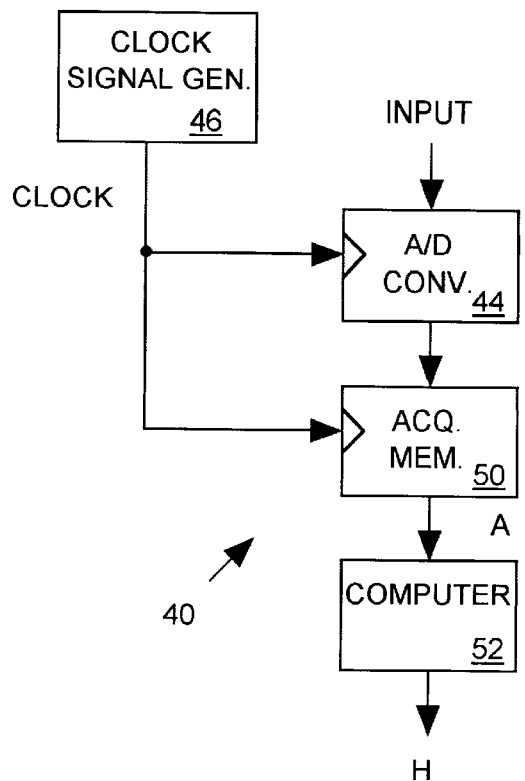
Figure 5:
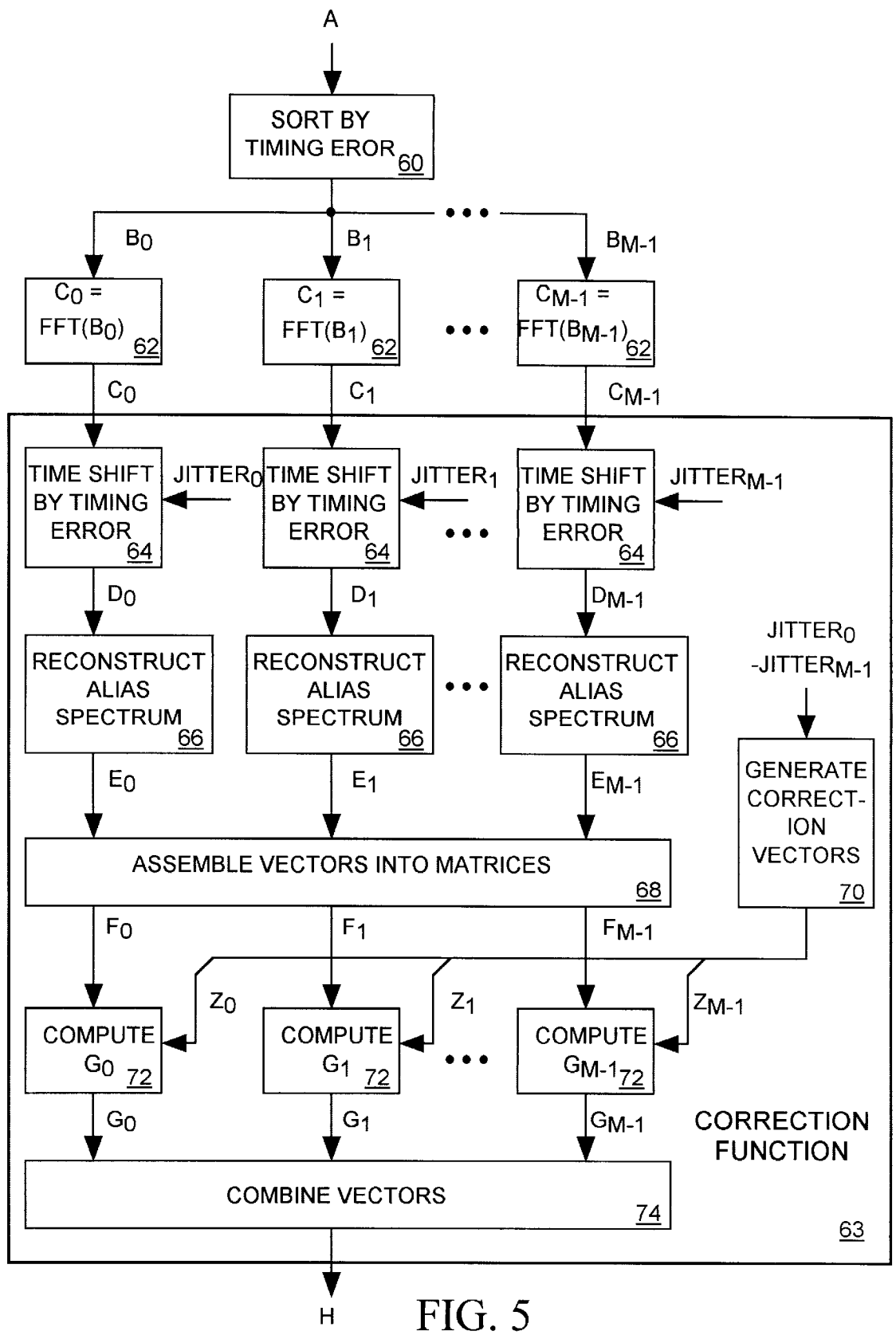
Figure 6:
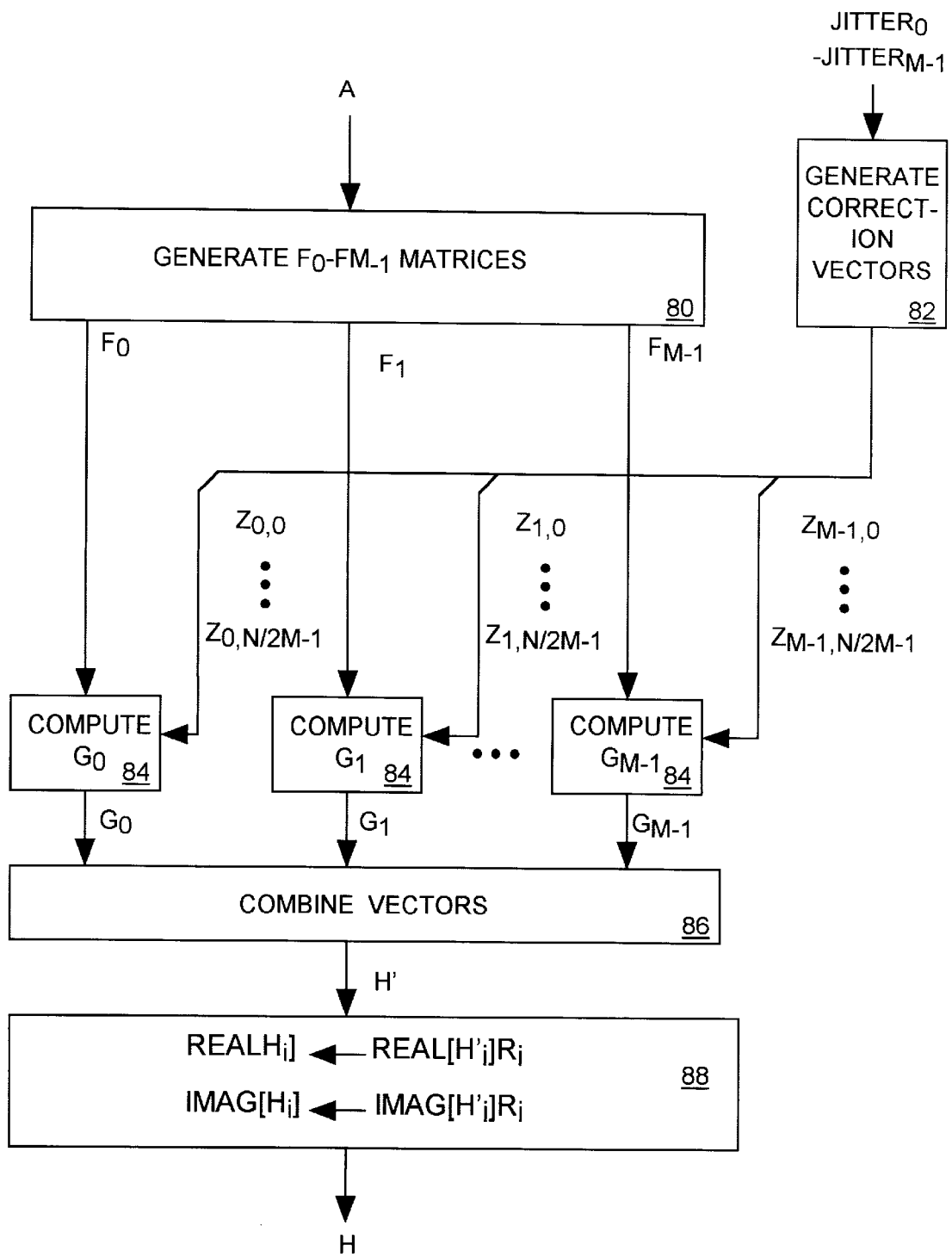

FIG. 1 illustrates a prior art spectrum analyzer for producing an output vector representing the amplitude and phase of the various frequency components of an analog input signal, FIG. 2 illustrates the clock signal generator of the spectrum analyzer of FIG. 1, FIG. 3 is a timing diagram depicting behavior of various signals of the clock signal generator of FIG. 2 as functions of time, FIG. 4 illustrates a spectrum analyzer in accordance with the invention for processing an analog input signal to produce an output vector representing the amplitude and phase of its various frequency components, FIG. 5 is a data flow diagram illustrating steps the computer of FIG. 4 carries out to determine the frequency spectrum of the input signal from the vector generated by the analog-to-digital converter of FIG. 4, and FIG. 6 is a dataflow diagram illustrating steps the computer of FIG. 4 carries out to determine the frequency spectrum of an input signal from the vector generated by the analog-to-digital converter of FIG. 4 when the frequency content of the sampled signal contains frequency components having frequencies more than one half of the sampling frequency (signal is undersampled).

DETAILED DESCRIPTION OF THE INVENTION

The present invention is directed to a spectrum analyzer for determining the frequency components of an analog signal based on data produced by periodically digitizing the analog signal. The spectrum analyzer automatically corrects its output data to compensate for jitter in a clock signal controlling the rate at which the analog signal is digitized. This specification and the accompanying drawings describe one or more exemplary embodiments and/or applications of the invention considered by the applicant(s) to be the best modes of practicing the invention.

FIG. 4 illustrates a spectrum analyzer 40 in accordance with the invention for processing an analog input signal (INPUT) to produce an output digital data sequence ("vector") H representing the amplitude and phase of its various frequency components. An analog-to-digital (A/D) converter 44 digitizes the INPUT signal on the leading edge of each successive pulse of a clock signal produced by a clock signal generator 46. Trailing edges of each clock signal pulse signal an acquisition memory 50 to store each successive data value produced by A/D converter 44. After N successive clock signal edges, acquisition memory 50 will contain a vector A having N elements $A_0$–$A_{N-1}$ representing N successive amplitudes of the INPUT signal. A computer 52 then reads vector elements $A_0$–$A_{N-1}$ out of acquisition memory 50 and processes them to produce an output vector H having 1+N/2 complex number elements, $H_0$–$H_{N/2}$, each representing the phase and magnitude of a separate frequency component of the INPUT signal.

If the clock signal had a jitter-free period of T between leading edges, then the $K^{th}$ clock signal edge must occur at a time KT relative to some reference time 0. However test system 40 is intended for use with a clock signal generator 46 that produces a clock signal having an average period T between edges for each set of N edges, but which has a predictable jitter of period TM. Thus for all integer values of K for 0<K<M, an actual timing of each $K^{th}$ clock signal edge and every Mth edge thereafter differs by a similar amount, $JITTER_K$, from the timing that edge would have had if the clock signal had a constant period T between cycles.

When computer 52 computes the output vector H representing the frequency spectrum of the INPUT signal from the $A_0$–$A_{N-1}$ sample data, it automatically compensates for the errors in clock signal timing due to the periodic jitter.

FIG. 5 is a flow chart illustrating the steps computer 52 of FIG. 4 carries out when processing the A/D converter output vector, $A_0$–$A_{N-1}$, to determine the frequency spectrum of the INPUT signal.

Sort by Timing Error (Step 60)

Computer 52 first sorts the data vector $A_0$–$N_{-1}$ into a set of M vectors, $B_0$–$B_{M-1}$ wherein each Kth vector $B_K$ is defined as follows:

$$B_K = \{A_K, A_{M+K}, A_{2M+K} \ldots A_{N-M+K}\}$$

Thus each of the M vectors $B_0$–$B_{M-1}$ includes N/M data elements, wherein the Kth vector $B_K$ includes the Kth element $A_K$ of the A/D converter output vector A and every Mth A vector element thereafter. This ensures that all data elements of $K^{th}$ vector $B_K$ were generated in response to clock signal edges having a similar timing error, $JITTER_K$.

FFT (Steps 62)

Each vector $B_0$–$B_{M-1}$ is then subjected to a conventional fast Fourier transform (FFT) function to produce a set of M vectors $C_0$–$C_{M-1}$. Each Kth vector $C_K$ of vectors $C_0$–$C_{M-1}$ includes a set of 1+N/2M complex number elements $\{C_{K,0}, C_{K,1}, \ldots C_{K,N/2M}\}$.

Apply correction function (Step 63)

Vectors $C_0$–$C_{M-1}$ are then subjected to a correction function having as parameters $JITTER_K$ for $0 \leq K < M$ to produce an output sequence H representing the frequency spectrum of the analog INPUT signal. The application of the correction function includes the set of substeps 64, 66, 68, 70, 72 and 74 as described below.

Time Shift (Steps 64)

Each $I^{th}$ element $C_{K,I}$ of each Kth vector $C_K$ of vectors $C_0$–$C_{M-1}$ for $0 \leq K < M$ and $0 \leq I \leq N/2M$ is then multiplied by a time shift function $$e^{-j2\pi\left(K+\frac{JITTER_K}{T}\right)I/N}$$

where j is the square root of −1, to produce another set of M vectors $D_0$–$D_{M-1}$. Thus each ith element $D_{K,I}$ of each Kth vector $D_K$ for i=0 to M−1, is computed as:

$$D_{K,I} = C_{K,I} e^{-j2\pi\left(K+\frac{JITTER_K}{T}\right)I/N}$$

Reconstruct Alias Spectrum (Steps 66)

The M vectors $D_0$–$D_{M-1}$ are then processed to reconstruct a set of M aliased spectrum vectors $E_0$–$E_{M-1}$, each having N/2 elements in the manner described below.

1. For each element $D_{K,I}$ ($0 \leq I < N/2M$) of each Kth vector $D_K$, a set of M/2 elements of a corresponding vector $E_K$ are computed as follows: for each value of J for $0 \leq J < M/2$ $$E_{K,I+JN/M} = D_{K,I}$$

2. For each element $D_{K,I}$ ($0 < I = < N/2M$) of each Kth vector $D_K$, a set of M/2 elements of a corresponding vector $E_K$ are computed as follows: for each value of J for $0 \leq J < M/2$ $$E_{K,N/M-I+JN/M} = D^*_{K,I}$$

where $D^*_{K,I}$ is the conjugate of $D_{K,I}$, and

3. For each vector $E_K$ a last element $E_{K,N/2} = 0$ is generated.

Rearrange Into M×N/M Matrices (Substep 68)

At this point the set of M vectors $E_0$–$E_{M-1}$ (each having 1+N/2 elements) are rearranged into a set of M matrices $F_0$–$F_{M-1}$, each having M rows and N/2M columns as follows:

$$F_K = \begin{vmatrix} E_{0,KN/2M} & E_{0,1+KN/2M} & \cdots & E_{0,N/2M-1+KN/2M} \\ E_{1,KN/2M} & E_{1,1+KN/2M} & \cdots & E_{1,N/2M-1+KN/2M} \\ \cdots & \cdots & \cdots & \cdots \\ E_{M-1,KN/2M} & E_{M-1,1+KN/2M} & \cdots & E_{M-1,N/2M-1+KN/2M} \end{vmatrix}$$

Generate Correction Vectors (Substep 70)

At step 70 a set of M correction vectors $Z_0$–$Z_{M-1}$ are generated by first generating an M×M matrix having elements $X_{r,c}$ wherein r is a matrix row number and c is a matrix column number as follows:

1. For each combination c of the set $\{0, 2, 4 \ldots\}$ and r for the set $\{0 \ldots M-1\}$ compute $$X_{r,c} = (1/2M)e^{j2\pi c\left(r+\frac{JITTER_r}{T}\right)/2M}$$

2. For each combination c of the set $\{1, 3, 5 \ldots\}$ and r for the set $\{0 \ldots M-1\}$ compute $$X_{r,c} = (1/2M)e^{j2\pi(c+1)\left(r+\frac{JITTER_r}{T}\right)/2M}$$

3. Create a matrix Y by inverting matrix X such that $Y = X^{-1}$.

4. Convert the Y matrix into an M×M correction matrix Z by conjugating elements of the odd numbered rows of the Y matrix and then dividing all elements of the resulting matrix by N.

5. Provide each successive one of the M rows of the Z correction matrix as a successive one of the M correction vectors $Z_0$–$Z_{M-1}$.

Compute Correction Vector-Matrix Product (Substeps 72)

A set of vectors $G_0$–$G_{M-1}$ are then produced wherein each Kth vector $G_K$ is the product of the M-element Kth correction vector $Z_K$ and the M×(N/2M) matrix $F_K$:

$$G_K = Z_K \times F_K.$$

Each vector $G_0$–$G_{M-1}$ will have N/2M elements.

Combine Vectors (Substep 74)

The vectors $G_0$–$G_{M-1}$ are then combined at substep 74 to form the 1+N/2 element output vector H as follows:

$$H = \{G_0, G_1, \ldots G_{M-1,0}\} = \{H_0, H_1, \ldots H_{N/2}\}$$

Input Aliasing

"Undersampling" occurs when the nominal period T of the CLOCK signal of FIG. 4 is greater than one half of the period of the highest frequency component of the INPUT signal. Undersampling produces a well-known type of distortion of the Fourier transform of the sampled signal known as "input aliasing". The method for correcting for effects of CLOCK signal jitter described above and illustrated in FIG. 5 is suitable when the INPUT signal has not been undersampled.

FIG. 6 illustrates a generally similar method that can be used when the INPUT signal has been undersampled. The method of FIG. 6 processes the input data sequence at step 80 using the same sequence of steps 60, 62, 64, 66 and 68 illustrated in FIG. 5 as described above. However it is necessary at steps 82 to multiply the vector forming each column of each matrix $F_0$–$F_{M-1}$ by a separate correction vector at step 72 to form the elements of vectors $G_0$–$G_{M-1}$. Thus instead of generating M correction vectors $Z_0$–$Z_{M-1}$ as illustrated at step 70 of FIG. 5, it is necessary to generate N/2 correction vectors $Z_{0,0}$–$Z_{M-1,(N/2M-1)}$ as illustrated at step 84 of FIG. 6.

The following describes the procedure carried out at step 82 of FIG. 6 to produce the set of N/2 correction vectors $Z_{0,0}$–$Z_{M-1,(N/2M-1)}$ employed at steps 82.

1. Create an array P of N/2 elements $P_0$–$P_{N/2-1}$ indicating the frequencies that can appear in the baseband frequency bins of the FFT function carried out at each step 62. For example when the CLOCK signal has a nominal 1 MHz frequency, N=1000 samples $A_0$–$A_{N-1}$ will alias an input frequency of 1995 KHz into 5 KHz which will appear in frequency bin 5 of the FFT output. If the INPUT signal contains a 1995 KHz frequency component, element five ($P_5$) of the frequency array P should be set to 1995000/1000=1995, the equivalent bin number of the frequency. No other input frequency energy should alias to this bin.

2. Create an array Q of N/2 elements $Q_0$–$Q_{N/2-1}$ such that the $i^{th}$ element $Q_1$ is the integer part of the quantity $(P_i+N/2)/N$.

3. Create an array R of N/2 elements $R_0$–$R_{N/2-1}$ wherein $R_i = 1$ when $P_i - Q_i * N$ is greater than or equal to 0 and wherein $R_i = -1$ otherwise.

4. Generate each $i^{th}$ matrix $S_i$ of a set of N/2M correction matrices $S_0$-$S_{(N/2M)-1}$ each having M rows and M columns. Let r be a row number and c a column number where $0 \leq c < M$ and $0 \leq r < M$, in what follows:

a. Generate each element $S_{i,r,c}$ residing at the intersection of each even numbered column c={0, 2, etc.} and each $r^{th}$ row of each $i^{th}$ matrix $S_i$ as follows:

$$S_{i,r,c} = (1/2M)e^{j2\pi x(r,c)}$$

where $$x(r, c) = R_{y(c)}Q_{y(c)}\frac{JITTER_r}{T} + \left(r + \frac{JITTER_r}{T}\right)c/2M$$

and where $$y(c) = i + cN/(2M)$$

b. Generate each element $S_{i,r,c}$ residing at the intersection of each odd numbered column c={1, 3, etc.} and each $r^{th}$ row of each $i^{th}$ matrix Si as follows:

$$S_{i,r,c} = (1/2M)e^{-j2\pi x(r,c)}$$

where $$x(r, c) = R_{y(c)}Q_{y(c)}\frac{JITTER_r}{T} + \left(r + \frac{JITTER_r}{T}\right)(c+1)/2M$$

and where $$y(c) = (N/M) - i + (c-1)N/2M$$

5. Invert each matrix $S_i$ and conjugate elements in the odd numbered rows of a resulting matrix to obtain a corresponding matrix $U_i$.

6. Divide each element of each $i^{th}$ matrix $U_i$ by N to create a corresponding matrix $V_i$.

7. For the vector forming each $c^{th}$ column $F_{i,c}$ of the ith matrix $F_i$ of FIG. 6, generate a corresponding r correction row vector $Z_{i,k}$ as follows $$Z_{i,k} = V_{c,i}$$

where $V_{c,i}$ is a vector formed by the $i^{th}$ row of matrix $V_c$ and where $$k = c + (i\text{MOD}(2))(N/2M - 2c)$$

where

MOD [ ] is the module function.

At steps 84 (FIG. 6) the $c^{th}$ element $G_{i,c}$ of each $i^{th}$ vector $G_i$ is calculated by finding the dot product of correction vector $Z_{i,c}$ and the $c^{th}$ column $F_{i,c}$ of the $i^{th}$ matrix $F_i$:

$$G_{i,c} = Z_{i,c} \cdot F_{i,c}$$

At step 86 (FIG. 6) the vectors $G_0$-$G_{M-1}$ are then combined to form the 1+N/2 element vector H' as follows:

$$H' = \{G_0, G_1, \ldots G_{M-1}, 0\} = \{H'_0, H'_1, \ldots H'_{N/2}\}$$

At step 88, some of the elements of vector H' are conjugated to convert vector H' into the output vector H. In particular, the real part READ[$H'_i$] of each ith element $H'_i$ of vector H' becomes the real part REAL [$H_i$] of a corresponding ith element $H_i$ of the output vector H, and the product IMAG[$H_i$]$R_i$ of the imaginary part of each ith element $H'_i$ of the H' vector and $R_i$ becomes the imaginary part IMAG[$H_i$] of the ith element $H_i$ of output vector H. $R_i$ is the ith element of array R created at substep 3 of step 82, and will have value 1 or −1, depending on the value of i.

Thus have been described methods for generating a data sequence output representing the discrete Fourier transform of both oversampled and undersampled INPUT signal when the CLOCK signal exhibits a periodic jitter. The methods eliminate the effects of the CLOCK signal jitter from the data sequence output. The foregoing specification and the drawings depict the best modes of practicing the invention, and elements or steps of the depicted best modes are provided as examples of the elements or steps recited in the appended claims. However the appended claims are intended to apply to any mode of practicing the invention comprising the combination of elements or steps as recited in any one of the claims, including elements or steps that are functional equivalents of the example elements or steps depicted in the specification and drawings. Should any appended claim describe an element or a step by providing a description of its particular function including no express structural limitations, then that description of the element or step is intended to read on anything capable of carrying out that particular function, regardless of its structure and regardless of the structure of any example element depicted in this specification or in the drawings.

What is claimed is:

1. A method for processing an analog signal to produce an output vector representing a frequency spectrum of the analog signal, the method comprising the steps of:

a. generating a periodically jittery clock signal of average period T seconds having N edges, wherein each $K^{th}$ generated edge and every Mth generated edge thereafter has a similar timing error of $JITTER_K$ seconds, wherein K is an integer $0 \leq K < M$, M and N/M are integers greater than 1, and wherein $JITTER_K$ is other than constant for all values of K;

b. digitizing the analog signal in response to each of the N clock signal edges to produce a vector (A) having N elements $A_J$, for all integer values of J, $0 \leq J < N$;

c. arranging all elements $A_J$ of vector A into M vectors $B_K$, for all integer values of K, $0 \leq K < M$, such that each $K^{th}$ vector $B_K$ includes a $K^{th}$ element $A_K$ of vector A and every Mth element of vector A thereafter;

d. separately subjecting each vector $B_K$ to a Fourier transform function to produce a corresponding one of a set of M vectors $C_K$, for all integer values of K, $0 \leq K < M$, and e. evaluating a correction function having as parameters $JITTER_K$ and vectors $C_K$, for all integer values of K, $0 \leq K < M$, to generate the output vector representing the frequency spectrum of the analog signal.

2. The method in accordance with claim 1 wherein step e comprises the substep of:

e1. multiplying each $I^{th}$ element of each one of vectors $C_K$, for all integer values of K, $0 \leq K < M$, by a time shift function $$K = e^{-j2\pi\left(K + \frac{JITTER_K}{T}\right)I/N}$$

where j is a square root of −1, to produce a corresponding one of a set of M vectors $D_K$.

3. The method in accordance with claim 2 wherein step e further comprises the substep of:

e2. processing vectors $D_K$ for all integer values of K $0 \leq K < M$, to construct a set of M aliased spectrum vectors $E_K$.

4. The method in accordance with claim 3 wherein step e2 comprises the substeps of:

e21. for each combination of integers I, J and K, where $0 \leq I < N/2M$, $0 \leq J < M/2$ and $0 \leq K < M$, setting an element $E_{K,I+JN/M}$ of a Kth vector $E_K$ of vectors $E_0$–$E_{M-1}$ equal to $D_{K,I}$.

e22. for each combination of integers I, J and K, where $0 \leq I < N/2M$, $0 \leq J < M/2$ and $0 \leq K < M$, setting an element $E_{K,N/M-I+JN/M}$ of a Kth vector $E_K$ of vectors $E_0$–$E_{M-1}$ equal to a complex conjugate of $D_{K,I}$, and e23. for each value of K, for $0 \leq K < M$, setting an element $E_{K,N/2}$ equal to 0.

5. The method in accordance with claim 3 wherein step e further comprises the substep of:

e3. arranging all elements of all vectors $E_K$, for all integer values of K, $0 \leq K < M$, into a set of M matrices $F_K$, each including M rows and N/2M columns of elements.

6. The method in accordance with claim 5 wherein each vector $E_K$ for all integer values of K $0 \leq K < M$, has N/2M elements $E_{K,0}$–$E_{K,N/2M-1}$, and wherein for all integer values of K $0 \leq K < M$, each matrix $F_K$ is formed by elements of vectors $E_K$ arranged as follows:

$$F_k = \begin{vmatrix} E_{0,(K-1)N/2M} & E_{0,1+(K-1)N/2M} & \cdots & E_{0,N/2M-1+(K-1)N/2M} \\ E_{1,(K-1)N/2M} & E_{1,1+(K-1)N/2M} & \cdots & E_{1,N/2M-1+(K-1)N/2M} \\ \cdots & \cdots & \cdots & \cdots \\ E_{M-1,(K-1)N/2M} & E_{M-1,1+(K-1)N/2M} & \cdots & E_{M-1,N/2M-1+(K-1)N/2M} \end{vmatrix}$$

7. The method in accordance with claim 5 wherein step e further comprises the substep of:

e4. generating separate correction vector $Z_{i,c}$ for all combinations of integer values of i $0 \leq i < M$, and $0 \leq c < N/2M-1$ as functions of JITTER1, each vector $Z_{i,c}$ corresponding to the $c^{th}$ column of the ith matrix $F_{i,c}$ formed at step e3; and e5. generating a separate element $G_{i,c}$ for each combination of integer values of i and c by finding a dot product of the correction vector $Z_{i,c}$ and its corresponding matrix column $F_{i,c}$.

8. The method in accordance with claim 7 wherein step e further comprises the substep of:

e6. combining elements $G_{i,c}$ for all integer combinations of i and c to form a vector $H'_i$, e7. conjugating elements of $H'_i$ to form a vector H representing the frequency spectrum of the analog input signal.

9. The method in accordance with claim 5 wherein step e further comprises the substep of:

e4. generating separate correction vector $Z_K$ for all integer values of K, $0 \leq K \leq M$, as functions of JITTER$_K$, each vector $Z_K$ corresponding to a separate one of matrices $F_K$; and e5. generating a separate vector $G_K$ for each integer value of K, $0 \leq K < M$ by finding a product of the vector $Z_K$ with its corresponding matrix $F_K$.

10. The method in accordance with claim 9 wherein step e further comprises the substep of:

e6. combining vectors $G_K$ for all integer values of K, $0 \leq K \leq M$ to form the output vector representing the frequency spectrum of the analog input signal.

11. The method in accordance with claim 10 wherein the output vector is the vector $\{G_0, G_1, \ldots G_{M-1}, 0\}$.

* * * * *

UNITED STATES PATENT AND TRADEMARK OFFICE
CERTIFICATE OF CORRECTION

PATENT NO. : 6,651,016 B1
DATED : November 18, 2003
INVENTOR(S) : Jonathan M. Shaw and John B. Shaw It is certified that error appears in the above-identified patent and that said Letters Patent is hereby corrected as shown below:

Column 10,
Line 1, "JITTER1" should be deleted and replaced with -- $JITTER_i$ --.
Line 18, "$0 \leq K \leq M$" should be deleted and replaced with -- $0 \leq K < M$ --.

Signed and Sealed this

Thirtieth Day of December, 2003

JAMES E. ROGAN
*Director of the United States Patent and Trademark Office*